(12) United States Patent
Leistad et al.

(10) Patent No.: US 7,764,529 B2
(45) Date of Patent: Jul. 27, 2010

(54) DATA STORAGE DEVICE

(75) Inventors: Geirr I. Leistad, Sandvika (NO); Per Broms, Linköping (SE); Christer Karlsson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 383 days.

(21) Appl. No.: 11/917,579

(22) PCT Filed: Jun. 8, 2006

(86) PCT No.: PCT/NO2006/000214

§ 371 (c)(1),
(2), (4) Date: Dec. 14, 2007

(87) PCT Pub. No.: WO2006/135245

PCT Pub. Date: Dec. 21, 2006

(65) Prior Publication Data

US 2008/0198640 A1    Aug. 21, 2008

(30) Foreign Application Priority Data

Jun. 14, 2005    (NO) ................................. 20052904

(51) Int. Cl.
*G11C 5/02* (2006.01)
(52) U.S. Cl. ......................................... 365/51; 365/145
(58) Field of Classification Search .................... 365/51, 365/145, 148, 189.011
See application file for complete search history.

(56) References Cited

U.S. PATENT DOCUMENTS

| | | | |
|---|---|---|---|
| 3,835,301 A | 9/1974 | Barney | |
| 5,060,191 A | 10/1991 | Nagasaki et al. | |
| 5,323,377 A | 6/1994 | Chen et al. | |
| 6,025,618 A | 2/2000 | Chen | |
| 6,249,503 B1 | 6/2001 | Aratani | |
| 6,380,597 B1 * | 4/2002 | Gudesen et al. | 257/390 |
| 2005/0050258 A1 | 3/2005 | Frommer et al. | |
| 2008/0198644 A1 * | 8/2008 | Broms et al. | 365/145 |

FOREIGN PATENT DOCUMENTS

| | | |
|---|---|---|
| EP | 1 653 459 A2 | 3/2006 |
| EP | 1 653 459 A2 | 5/2006 |
| EP | 1 653 473 A2 | 5/2006 |
| EP | 1653459 A2 | 5/2006 |
| JP | 2005-71590 A | 3/2005 |

OTHER PUBLICATIONS

MEMS-Based Integrated-Circuit Mass-Storage Systems—Abandoning the rotating disk paradigm, simple miniature microelectromechanical systems position probe tips over the storage media, potentially creating a new generation of nonvolatile rewritable mass storage devices, as well as support for multitude of "intelligent" gadgets, pp. 72-80, Jan. 6, 2010.

* cited by examiner

*Primary Examiner*—Vu A Le
(74) *Attorney, Agent, or Firm*—Birch, Stewart, Kolasch & Birch, LLP

(57) ABSTRACT

In a non-volatile electric memory system a card-like memory unit (10) and a read/write unit (11) are provided as physically separate units. The memory unit (10) is based on a memory material (4) that can be set to at least two distinct physical states by applying an electric field across the memory material. The read/write unit (10) comprises contact means (9) provided in a determined geometrical pattern enabling a definition of memory cells in memory unit (10) in an initial write operation, the memory cells being located in a geometrical pattern corresponding to that of the contact means (9). Establishing a physical contact between the memory unit (10) and the read/write unit (11) closes an electrical circuit over an addressed memory cell such that read, write or erase operations can be effected. The memory material (4) of the memory unit (10) can be a ferroelectric or electret material that can be polarized into two discernible polarization states, or it can be a material with a resistive impedance characteristic such that a memory cell of the material can be set to a specific stable resistance value by the application of an electric field.

9 Claims, 2 Drawing Sheets

DATA STORAGE DEVICE

Figure 1:
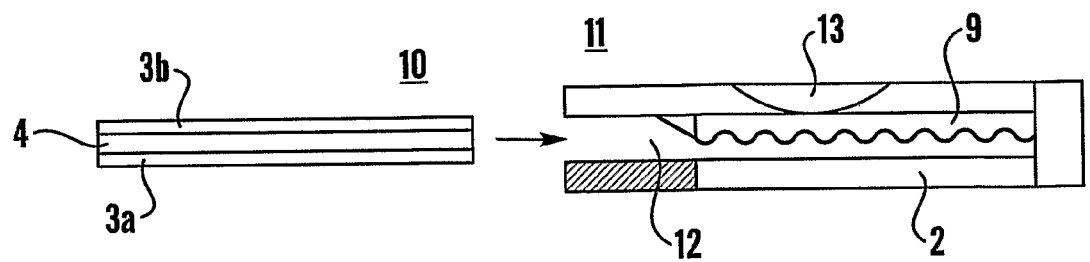

The present invention, which claims priority from Norwegian patent application No. 20052904, concerns a data storage device comprising a card-like memory unit and a read/write unit provided as physically separate units, wherein the memory unit comprises a layer of a memory material capable of attaining at least two distinct physical states and/or being set to either thereof or switched therebetween upon applying an electric field across the memory material, wherein said at least two distinct physical states are characterized by an impedance value or a polarization value, wherein the electric field is applied at specific positions and with a specific direction so as to define a memory cell with a determined extension in a volume of the memory material at the specific position for storing a datum given by a logical value as assigned to the distinct physical state set in the memory cell by the applied electric field, wherein the logical value can be detected and read by applying a potential difference across the memory cell, wherein the memory unit comprises a global layer of memory material, wherein the memory unit comprises a common bottom electrode interfacing and contacting the memory layer, and wherein the read/write unit is a moveable unit, for instance a hand-held apparatus, comprising a set of contact means provided in a geometrical arrangement of pattern such that on applying the read/write unit to the memory unit in an initial write operation to a virgin memory layer, memory cells forming bit spots are generated therein in a geometrical arrangement or pattern in exact correspondence with that of the contact means in the read/write unit.

There are a number of situations when there is a need for a method to locally store digital information on objects. Today there are three dominating methods to achieve this. The first is to use a magnetic material that is read and written using an external read/write unit, the second is to use printed bar codes that are a form of read-only memories being read by optical methods, and the third is to use chip-based memories such as flash memories. The different techniques all have their strengths and weaknesses. The chip based memories (e.g. SIM-cards) include the drive circuits and control logic on the memory device, causing high manufacturing costs. Also, the chip-based memories require transistors to be present on the memory devices something which results in that the number of possible manufacturing methods is limited. In practice they are all built on Si wafers. The magnetic stripes are re-writeable, but bar codes are not. Magnetic stripes, as used today, are read by an external unit that has a relative speed compared to the memory device, while bar codes are normally read while the read unit and the memory device are at rest. The bar codes are very low cost printed devices, while the magnetic stripe must be manufactured in a controlled environment and later laminated inside the target item. The data densities of the bar codes are very low, and the data capacity of the magnetic stripes is limited by the length of the stripe since it is read using a constant relative speed between the memory and the read/write unit. In practice the storage capacity of magnetic stripes are limited to not much more than a few hundred bytes. The drawbacks of the magnetic stripes, such as limited data content, high manufacturing costs and the need for a relative speed between the memory device and the read/write equipment are inherent and undesirable.

Considering the disadvantages of existing technologies and solutions for simple memory cards and considering their extremely widespread and frequent use it is evident that there is a need for a improvement in the technology based on data storage means that can be implemented in the conventional and readable memory card format and in addition provide a significant gain with respect to quality, storage capacity, simplicity, reliability, particularly for read/write operations, and which moreover can be manufactured in high volumes and low cost. This also implies that it should be rewriteable and be employed with rewrite equipment that does not differ conceptually from today's card readers; it should for instance not require any moving parts, and the input/output operations should be performed without maintaining a relative speed between the memory card and the read/write equipment. Also a memory card of this kind should be possible to manufacture with low cost high-volume manufacturing methods. These include as per se conventional printing techniques which up to now to little extent have been applied to the manufacturing in the electronics and integrated circuit industry, but nevertheless has been shown to be able to fabricate high-performance components reliably and with high yield. In addition printing techniques also have the advantage that they make it a lot more easy to employ different materials, inorganic as well as organic, as the constituents of the components manufactured, but at the same time the incompatibility problems encountered in conventional fabricating processes when using such materials are avoided. These incompatibility problems may be thermal, mechanical or chemical and can significantly impair the functionality of one or more functional materials.

A prior art memory card system is known from U.S. Pat. No. 3,835,301 (Barney) and comprises a memory card which may be provided with an invisible code. An apparatus that is used for coding the card can also be used for reading back the code on the card and convert it to an information display as defined by the code. The coding and read apparatus comprises patterned contact means and a base plate with a receptable for receiving the memory card. The receptable for receiving the memory card is provided as a recess in the base plate and coextensive with the card. The bottom of this recess forms a bottom or return electrode of the apparatus. In a coding operation the memory card 18 is provided with bit spots by placing the card in the receptable 20 and applying the coding means proper 10 to the top surface of the card. Bit spots will then be formed according to the pattern of provided contacts in the coding means. The memory medium of the memory card is a paper material that is able to change its resistive impedance under an electric field, thus enabling coding of information therein.

Another relevant prior art memory unit 10 is shown in cross section in FIG. 1 and with a global memory material 4 inserted between optional protective layers 3*a*, 3*b*. As a matter of fact it will be possible to manufacture the memory cards to consist of the memory material only and particularly of a suitable polymer material, which also is the memory material. It would then of course resemble an ordinary plastic memory card. The memory unit can be inserted in a receptable 12 in a read/write unit 11. The read/write unit 11 comprises a common electrode 2 with the same extension as a memory area of the memory unit 10, and contact means 9 provided in one or more linear arrays or a square or rectangular matrix formed by such linear arrays facing the common electrode 2. The contact means may be provided with a spring action 13, e.g. furnished by a leaf spring means as shown and when the memory unit 10 is inserted in the receptable 12 of the read/write unit 10 the contact means can for instance be displaced upwards against the spring force which maintains a secure grip and contact between the contact means 9, the memory unit 10 and the common electrode 2 to enable a proper electrical addressing thereof by applying a potential across the memory material 4 in the memory unit 10 between one of the contact means 9 as shown and the common electrode 2, thereby being able to define in an initial writing operation a memory cell in the memory layer 4 of the memory unit 10. The memory layer 4 could be made of a material capable of changing its impedance in an electric field as known from the above-mentioned U.S. Pat. No. 3,835,301.

Figure 2:
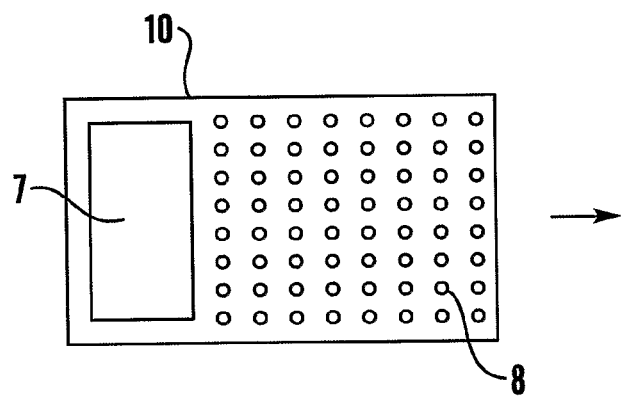

The prior art memory unit 10 of FIG. 1 is shown in the plan view of FIG. 2 with a memory area 8 of memory cells or bit spots forming an 8·8 memory cell array. The contact means 9 of the read/write unit 10 are of course disposed in a matching array. An area 7 outside the matrix of memory cells could be reserved for gripping/handling purposes and might contain visible characters or owner identifying marks and the like, as with conventional memory cards used for banking and payment purposes.

Figure 3:
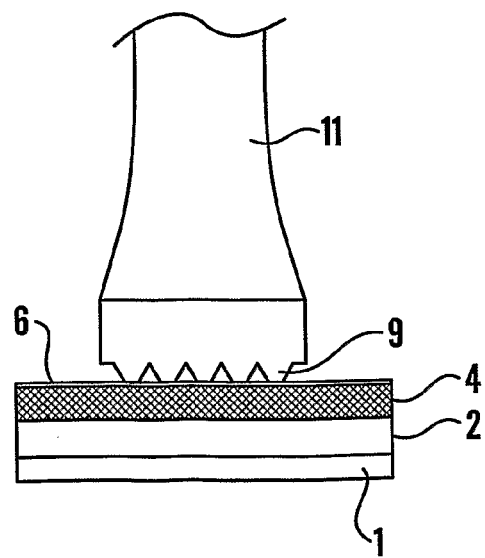

Yet another relevant prior art data storage device is shown in FIG. 3. A memory unit of this device comprises a bottom electrode 2 provided on substrate 1 which is not strictly necessary. Above the bottom electrode a global layer 4 of memory material is provided such that the common bottom electrode 2 and the memory layer 4 are coextensive. This is an embodiment of the memory unit which is suitable for use with a read/write unit 11 as mentioned above. This read/write unit 11 can be a hand-held or otherwise moveable unit. In the memory unit in FIG. 3 a memory cell is defined in the memory layer 4 in an initial write operation with the memory material in an initial virgin state, i.e. with no data set or written and determined by the position of the contact means 9 of the read/write unit 11 in a read/write head thereof. The arrangement or pattern of the contact means 9 can e.g. resemble a linear array, or a square or rectangular matrix composed of such arrays, but actually there is no limitation on the actual pattern selected for the contact means 9 in the read/write unit 11.

Finally, a prior art data storage device is disclosed in U.S. Pat. No. 5,323,377 (Chen & al.) which discloses electrical recording or retrieving of data in a data storage device by producing and detecting impedance change, for instance a change in the resistance of data spots generated in the memory layer. By appropriate choice of materials for the memory layer the data can be erased and new data written onto the layer. A separate read unit shall allow the creation of freely configurable pattern of data spots in the memory layer. However, recording and retrieving data, i.e. write and read, requires two separate units; an obvious disadvantage.

Similar to the data storage device shown in FIG. 3, the pattern of bit spots may be freely created, i.e. they are only configured by the application of the recording apparatus. In case of prior art shown in FIG. 3 the configuring is given by the arrangement of the contact means of the write/read unit. This implies specific requirements with regard to the precision of positioning the write/read unit of the prior art device of FIG. 3 or the data retrieval or read apparatuses of U.S. Pat. No. 5,323,377. Moreover there may in both cases be problems with defining the data spots with the required precision. They can easily be blurred or spatially not well defined. This could lead to readout errors, but shall also serve to limit the data recording density.

Hence a primary object of the present invention is to provide a data storage device wherein the above-mentioned problems will not be present and specifically then to obtain a high density recording of data in a freely generated pattern by means of a separate write/read unit.

Another object of the present invention is to provide such memory cards based on data-storage technologies which hitherto has been applied only to more advanced data storage systems.

A further object is to provide such memory card wherein data are stored and input and output by electrical means, and then with a structure as simple as that of any known prior art memory card.

A final, but important object of the invention is to be able to employ novel materials including organic ones for the memory media, and which moreover can be processed by fabrication methods which do not impair the performance.

The above objects as well as further features and advantages are realized with a data storage device according to the invention, which is characterized in that the memory unit comprises a common top electrode interfacing and contacting the memory layer the top electrode being made of an anisotropic conducting material whereby an established stationary contact between the top electrode and the set of contact means of the read/write unit in an initial write operation to a virgin memory layer in the memory unit generates memory cells in the memory layer at a spot position where the contact means contacts the memory layer, such that the memory cells become disposed therein in the same geometrical arrangement or pattern as that of the contact means in the read/write unit, and that the top electrode is anisotropic conducting such that by applying a potential difference over the memory layer, the geometrical extension of a memory cell defined in this manner in an initial write operation will be limited by the extension of the individual contact means.

Additional features and advantages of the data storage system of the present invention will be apparent from preferable embodiments as disclosed in the appended dependent claims.

The invention shall now be explained in more detail by resorting to a discussion of exemplary embodiments thereof and with reference to the accompanying drawing figures, wherein FIG. 1 shows a prior art data storage device, as mentioned above, FIG. 2 a plan view of a memory unit of the prior art data storage device in FIG. 1, as mentioned above, FIG. 3 another prior art data storage device as mentioned above, FIG. 4 a preferred embodiment of the data storage device according to the present invention.

The present invention shall be better understood from the following discussion of a preferred embodiment thereof, particularly in regard of the memory unit itself.

It should be noted that the present invention in regard of the memory materials used as well of the general pattern chosen for the layout of memory cells, contact means and electrodes and so on generally will resemble of corresponding features of the parent application. Thus, the present application is based on the same memory materials, viz. ferroelectric or electret memory materials, or memory materials showing a linear or non-linear impedance characteristic and which under the application of an electric field of specific strength can be set to a specific resistance value. As will be seen, the present invention in its most general aspects resemble prior art memory units by comprising a global memory layer and a common bottom electrode only integrated to form the memory unit with a card-like configuration. The distinguishing features of the present invention as well as its function and operation will be understood from the following discussion of a preferred embodiment of the data storage device of the invention as depicted in FIG. 4.

Figure 4:
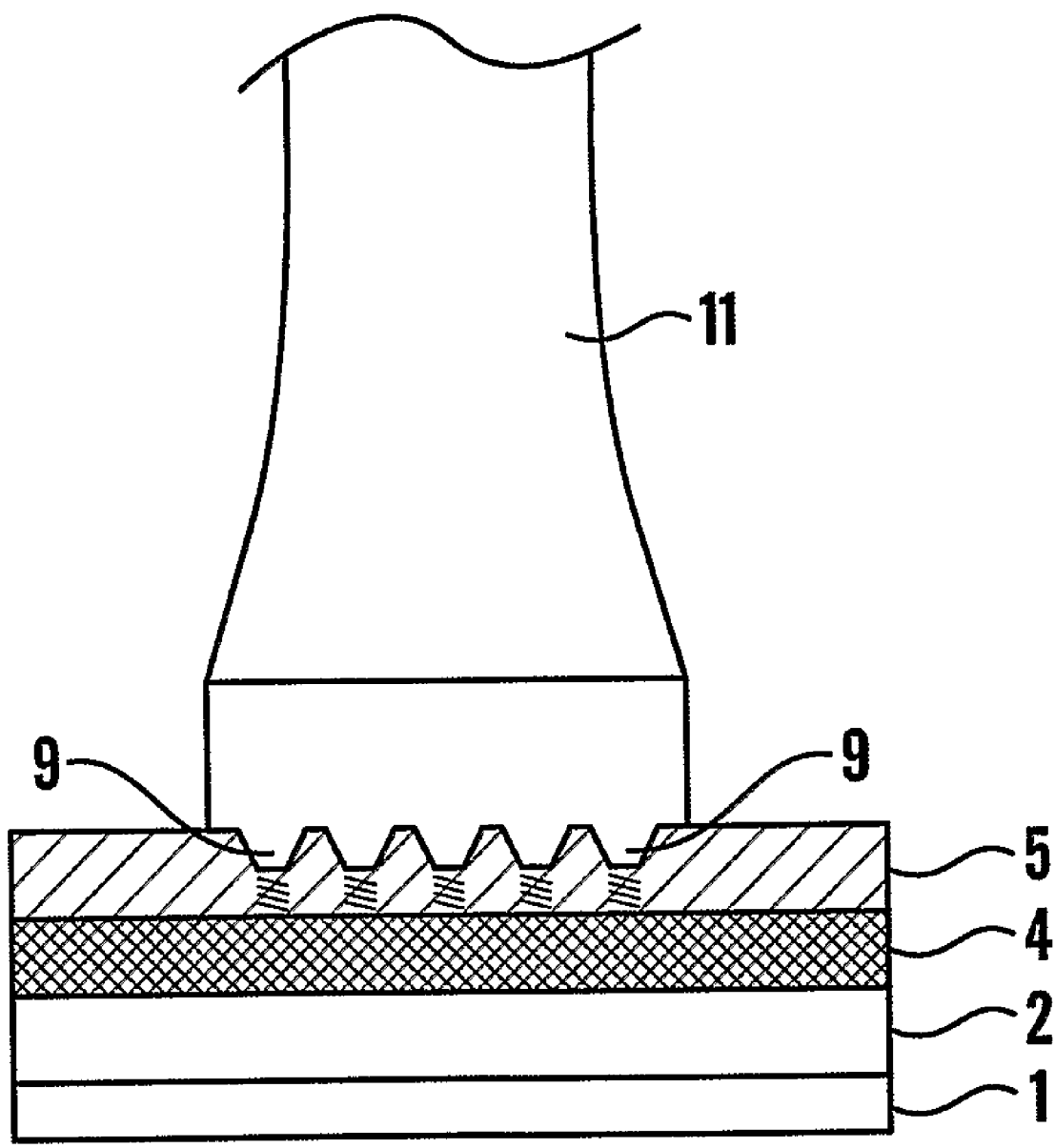

In a preferred embodiment of the data storage device according to the present invention shown in FIG. 4, an initially pattern-free memory unit is provided with a common top electrode 5 made of an anisotropic conducting material.

Apart from the top electrode 5, this embodiment of course will resemble the prior art device in FIG. 3 and discussed above. As in the latter, a common bottom electrode 2 is provided on the opposite side of the memory layer 4 and also in this embodiment there will of course be no need for patterning the electrodes. The anisotropic conducting material of the top electrode 5 will ensure that the top electrodes 5 conduct only in the vertical direction and no current will flow laterally, i.e. parallel to the memory layer 4 due to the very high resistivity of the top electrode 5 in this direction. Moreover the top electrode 5 can be resilient and deformable when applying the contact means 9 of the read/write unit 11 with a certain pressure, as shown. When the contact means 9 in the form of pins or pads are pressed in the anisotropic electrode material, this creates low resistance volumes between the contact means 9 and the memory material 4.

As will be obvious to people skilled in the art, before any data are written to the memory layer 4, it is in an initial virgin state for instance as is the case if it is a ferroelectric material. It should be noted that if an unpolarized ferroelectric material has been polarized, i.e. written, it cannot easily be returned to its virgin or unpolarized state by electrical means. If it is a resistive material, this can be set to a virgin state, i.e. erased or "unwritten", simply by reversing the direction of the field after the memory cell has been defined by setting a specific resistance value at the position given by the contact means in question applied. Anyway, it is now possible to define an array or matrix or bit spots or memory cells in the global memory layer 4.

Since it is the area between the read/write unit and the memory layer 4 that defines the space and location of each memory cell, it is important that the positioning of the read/write unit is repeatable through a plurality of read and write operations. In the preferred embodiment this can be achieved by visual markings on the memory, or by oversampling. The latter can be realized by providing the contact means 9, e.g. in the form of contact pins or pads, in the read/write unit much more densely packed than an actual memory cell and spacing in the memory unit 10 itself. A plurality of neighbouring contact means 9 in the form of said pins or pads will then sense one and the same memory cell and by analysing the readout pattern, the actual distribution of memory cells in the array can be determined along with their data content. In writing to the memory cells in this embodiment, a plurality of neighbouring contact means 9 in the read/write unit 11 is used to create a single memory cell in the memory unit. In this particular embodiment it is imperative that good mechanical contact can be obtained between the contact means 9 of the read/write unit 11 and the memory layer 4 as a high voltage to distance ratio otherwise may induce sparks in thin air gaps, something which may possibly lead to a deterioration of the memory material, which usually is deposited to form the memory layer as a very thin film.

The electrodes could be manufactured using metal deposited and patterned by any standard method such as evaporation, sputtering, and photolithographic techniques or using e.g. polymer based conductive inks deposited by e.g. inkjet, flexo-printing or any other appropriate technique. The memory film could be deposited by spin-coating a layer of electric film between the two electrode layers. Other techniques, such as inkjet, flexo-printing, evaporation etc. can also be used to deposit the electric memory layer.

It is to be understood that in any embodiments all layers constituting the memory unit 10 shall be coextensive. Thus any electrodes of the memory unit occupy the same area as the memory layer 4 thereof. In this context it should be understood that the read/write unit 11 may comprise driving, sensing and control circuitry connected with the contact means 9 and the electrode 2, but that said circuitry could also be provided in a not shown external unit connectable with the read/write unit 11.

In the present invention in the embodiment shown in FIG. 4 the substrate 1 may be replaced by a common bottom electrode 2, which can be made fairly thick.

The read/write unit 11 has two main tasks. The first is to generate the needed voltage waveforms to control the read and write of memory cells. The second is to sense the state of the memory cells during read.

The operation of the memory requires that well-controlled voltage waveforms both in time and magnitude are applied to the electrodes. This can be achieved either with standard discrete electronic components or with an application specific integrated circuit. If the memory material is a ferroelectric material large enough applied voltage will force the dipoles in the ferroelectric memory film to align in the direction of the electric field between the electrodes, thus storing information in the polarization direction of the material. Basic information on the operation of ferroelectric memory cells is available in the literature. Similarly a material having resistive impedance characteristics can have its resistance set by an applied external field thus being able to store data represented by stable resistance values. A memory material of this kind, for instance a metal-organic salt like M(TCNQ), could be used to realize multibit memory cells.

The sense circuitry shall make a decision on the state of the memory cell based on the amount of charge coming from the cell due to the charge displacement in the ferroelectric material during the read voltage pulse. This can e.g. be done with a simple Sawyer tower configuration or with a current integrator, both of which can be realised with discrete circuits. For large capacity memories however, it may be worthwhile to construct an application specific integrated circuit to do this.

If the memory material of the data storage device of the invention is a ferroelectric or electret material capable of being polarized in either of two remanent polarization states and exhibiting hysteresis, a datum is stored in a memory cell by assigning a logical value to either of its remanent polarization states, i.e. the negative or positive polarization state. Read and write operations are carried out on the hysteresis curve by applying electric fields of suitable strength over the memory cell, whereby a switching of the polarization state can be effected by applying a field with a coercive field strength higher than that of a memory cell and a direction opposite the polarization vector of the memory cell. It should be noted that ferroelectric materials properly are a subclass of electret materials. A number of candidate ferroelectric materials well known to a person skilled in the art may include inorganic ceramic materials such as lead zirconate titanate (PZT) or more preferable organic and easily printable ferroelectric oligomers, polymers, or co-oligomers including the well-known poly(vinylidene fluoride-trifluoroethylene) which presently is the most commonly used organic ferroelectric material. Generally these organic ferroelectric materials are inherently incapable of forming diode junctions with a contacting metallic electrode.

In the data storage device according to the present invention the memory material could also be selected as a dielectric material with a linear or non-linear resistive impedance. A material of this kind can be set to specific resistance values by the application of an electric field, and by varying the field strength it is possible to set a plurality of specific resistance states in the memory material. In other words, it is possible to store data with multibit coding, e.g. selecting as a set value as one of e.g. four or eight etc. resistance levels and thus being able to store respectively two, three, or more bits. The specific field strength applied will determine the resistance value set. It is also possible to erase the set resistance values by reversing the field. It should also be noted that some (or most) candidate resistive memory materials shall not be able to spontaneously form a diode junction with the contacting metallic electrode, but in order to form such a diode junction a layer of semiconducting material can be provided between the memory layer and the electrode, and a Schottky junction will then be generated. A semiconducting layer could in case be identified with the layer 6, as shown in the prior art device in FIG. 3. In the device according to the present invention a similar semiconducting layer could be provided between the memory layer 4 and the top electrode 5. A person skilled in the art will be familiar with candidates for the resistive memory materials, but they may for instance be selected as a phthalocyanine compound, an organic small-molecule compound, a metal-organic salt like the well-known M(TCNQ), an oligomer, a polymer or a copolymer.

The invention claimed is:

1. A non-volatile electrical data storage device comprising a card-like memory unit and a read/write unit (11) provided as physically separate units, wherein the memory unit comprises a layer of a memory material (4) capable of attaining at least two distinct physical states and/or being set to either thereof or switched therebetween upon applying an electric field across the memory material (4), wherein said at least two distinct physical states are characterized by an impedance value or a polarization value, wherein the electric field is applied at specific positions and with a specific direction so as to define a memory cell with a determined extension in a volume of the memory material at the specific position for storing a datum given by a logical value as assigned to the distinct physical state set in the memory cell by the applied electric field, wherein the logical value can be detected and read by applying a potential difference across the memory cell, wherein the memory unit comprises a global layer (4) of memory material, wherein the memory unit comprises a common bottom electrode (2) interfacing and contacting the memory layer (4), wherein the read/write unit (11) is a moveable unit, for instance a hand-held apparatus, comprising a set of contact means (9) provided in a geometrical arrangement of pattern such that on applying the read/write unit to the memory unit in an initial write operation to a virgin memory layer (4), memory cells forming bit spots are generated therein in a geometrical arrangement or pattern in exact correspondence with that of the contact means (9) in the read/write unit (11) and wherein the data storage device is characterized in that the memory unit comprises a common top electrode (5) interfacing and contacting the memory layer (4), the top electrode (5) being made of an anisotropic conducting material whereby an established stationary contact between the top electrode (5) and the set of contact means (9) of the read/write unit (11) in an initial write operation to a virgin memory layer in the memory unit generates memory cells in the memory layer (4) at a spot position where the contact means (9) contacts the memory layer (4), such that the memory cells become disposed therein in the same geometrical arrangement or pattern as that of the contact means (9) in the read/write unit (11), and that the top electrode (5) is anisotropic conducting such that by applying a potential difference over the memory layer, the geometrical extension of a memory cell defined in this manner in an initial write operation will be limited by the extension of the individual contact means (9).

2. A data storage device according to claim 1, characterized in that the contact means (9) of the read/write unit (11) are provided as one or more linear arrays or as a square or rectangular matrix wherein the rows and columns are formed by said linear arrays.

3. A data storage device according to claim 2, characterized in that the memory cells generated in the memory unit are provided in one or more linear arrays or as a square or rectangular matrix, said linear arrays forming either rows and columns thereof.

4. A data storage device according to claim 1, characterized in that the contact means (9) of the read/write unit (11) are connectable with driving, sensing and control means located either in the read/write unit (11) or in a peripheral unit connected with the latter.

5. A data storage device according to claim 1, characterized in that the memory material (4) is a ferroelectric or electret material capable of being polarized in either of two opposite directions and exhibiting hysteresis, and that data are stored in a memory cell defined in the ferroelectric or electret memory material by assigning a logical value to either of its remanent polarization states.

6. A data storage device according to claim 5, characterized in that the ferroelectric or electret memory material (4) is an inorganic ceramic material of the perovskite kind, an oligomer, a polymer or a co-polymer such as poly(vinylidene fluoride-trifluoroethylene) [P(VDF-TrFE)].

7. A data storage device according to claim 1, characterized in that the memory material (4) is a dielectric material having linear or non-linear resistive impedance characteristics and which can be set to specific resistance values upon the application of a suitable potential difference or electric field thereacross, that data are stored as specific resistance values in the memory cells, logical values being assigned to said specific resistance values and that the logical values are read and detected by applying a suitable sensing potential difference across the memory material, said sensing potential difference having a value that does not alter the set resistance value of the memory cell.

8. A data storage device according to claim 7, characterized in that the resistive memory material (4) is a phthalocyanine compound, an organic small molecule compound, a metal-organic salt like M(TCNQ), an oligomer, a polymer, or a copolymer.

9. A data storage device according to claim 7, characterized in that a layer of an inorganic or organic semiconductor material has been provided adjacent to the memory layer (4) comprising the resistive memory material and between the top electrode (5), such that a diode junction is formed between the layer of semiconducting material and the top electrode (5).

* * * * *